(12) United States Patent
Jing

(10) Patent No.: US 12,557,514 B2
(45) Date of Patent: Feb. 17, 2026

(54) DISPLAY SUBSTRATE, DISPLAY APPARATUS AND MASK PLATE

(71) Applicant: BOE Technology Group Co., Ltd., Beijing (CN)

(72) Inventor: Shu Jing, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 468 days.

(21) Appl. No.: 18/024,147

(22) PCT Filed: Oct. 22, 2021

(86) PCT No.: PCT/CN2021/125519
§ 371 (c)(1),
(2) Date: Mar. 1, 2023

(87) PCT Pub. No.: WO2022/156286
PCT Pub. Date: Jul. 28, 2022

(65) Prior Publication Data
US 2023/0276675 A1    Aug. 31, 2023

(30) Foreign Application Priority Data

Jan. 19, 2021 (CN) .......................... 202110069920.9

(51) Int. Cl.
*H10K 59/35* (2023.01)
*C23C 14/04* (2006.01)
(Continued)

(52) U.S. Cl.
CPC ......... *H10K 59/353* (2023.02); *C23C 14/042* (2013.01); *C23C 14/08* (2013.01);
(Continued)

(58) Field of Classification Search
CPC .. H10K 59/352; H10K 59/353; H10K 59/879; C23C 14/12; C23C 14/08; C23C 14/042
See application file for complete search history.

(56) References Cited

U.S. PATENT DOCUMENTS

2010/0059778 A1* 3/2010 Shimizu ................. B82Y 30/00
257/E33.064
2012/0286300 A1   11/2012 Kijima
(Continued)

FOREIGN PATENT DOCUMENTS

CN      108123055 A     6/2018
CN      110364637 A    10/2019
(Continued)

OTHER PUBLICATIONS

PCT/CN2021/125519 international search report.

*Primary Examiner* — Jaehwan Oh
(74) *Attorney, Agent, or Firm* — IPro, PLLC

(57) ABSTRACT

The display substrate includes: a base substrate including sub-pixel regions with opening regions and non-opening regions; light-emitting devices each including a first electrode, a light-emitting layer and a second electrode; a first light extraction layer between a light-emitting layer and a second electrode; and a second light extraction layer on the side of the second electrode away from the first light extraction layer. The first light extraction layer is provided in at least part of a non-opening region, and the refractive index of the first light extraction layer is greater than the refractive index of the second electrode. An orthographic projection of the second light extraction layer on the base substrate completely covers an orthographic projection of the first light extraction layer on the base substrate, and the refractive index of the second light extraction layer is greater than the refractive index of the second electrode.

20 Claims, 10 Drawing Sheets

(51) Int. Cl.
*C23C 14/08* (2006.01)
*C23C 14/12* (2006.01)
*H10K 59/80* (2023.01)

(52) U.S. Cl.
CPC ........... *C23C 14/12* (2013.01); *H10K 59/352* (2023.02); *H10K 59/879* (2023.02)

(56) References Cited

U.S. PATENT DOCUMENTS

| | | |
|---|---|---|
| 2018/0151826 A1 | 5/2018 | Huang et al. |
| 2019/0312235 A1 | 10/2019 | Fukuoka et al. |
| 2021/0104581 A1* | 4/2021 | Fukuoka ............... H10K 50/865 |
| 2021/0305334 A1* | 9/2021 | Xu ........................ H10K 59/353 |
| 2023/0067641 A1* | 3/2023 | Zeng ................... H10K 50/8445 |
| 2023/0096304 A1* | 3/2023 | Yuan .................... H10K 59/122 |
| | | 257/91 |

FOREIGN PATENT DOCUMENTS

| | | | |
|---|---|---|---|
| CN | 111341820 A | 6/2020 | |
| CN | 112885976 A | 6/2021 | |
| JP | 2003234178 A | 8/2003 | |

\* cited by examiner

DISPLAY SUBSTRATE, DISPLAY APPARATUS AND MASK PLATE

CROSS-REFERENCE OF RELATED APPLICATIONS

The present application is a national phase entry under 35 U.S.C. § 371 of International Application No. PCT/CN2021/125519 filed on Oct. 22, 2021, which claims the priority of Chinese Patent Application No. 202110069920.9, filed with the China National Intellectual Property Administration (CNIPA) on Jan. 19, 2021 and entitled "Display Substrate, Display Apparatus and Mask Plate", the entire content of which is hereby incorporated by reference.

FIELD

The disclosure relates to the field of display technology, and in particular to a display substrate, a display apparatus and a mask plate.

BACKGROUND

The Organic Light-Emitting Diode (OLED) display apparatus is a display screen based on an organic electroluminescent diode, has excellent characteristics such as self-illumination, high contrast, high resolution, small thickness, wide viewing angle, fast response speed, color saturation, low energy consumption, usability for flexural panels, wide operating temperature range, simple structure and manufacturing process, etc., and is honored as dream display, has received more and more attention, and has a broad application prospect.

BRIEF SUMMARY

In one aspect, embodiments of the disclosure provide a display substrate, including:
  a base substrate including a plurality of sub-pixel regions, wherein each sub-pixel region includes an opening area and a non-opening area;
  a plurality of light-emitting devices located on the base substrate; wherein each light-emitting device includes a first electrode, a light-emitting layer and a second electrode stacked; the first electrode and the light-emitting layer of each light-emitting device are correspondingly arranged in one opening area, and the second electrodes of all the light-emitting devices form an integrated planar electrode;
  a first light extraction layer located between the light-emitting layer and the second electrode and arranged in at least part of the non-opening area, wherein a refractive index of the first light extraction layer is greater than a refractive index of the second electrode;
  a second light extraction layer located on a side of the second electrode away from the first light extraction layer, wherein an orthographic projection of the second light extraction layer on the base substrate completely covers an orthographic projection of the first light extraction layer on the base substrate, and a refractive index of the second light extraction layer is greater than the refractive index of the second electrode.

Optionally, in the above display substrate according to the embodiments of the disclosure, the second light extraction layer is arranged on an entire surface of the second electrode.

Optionally, in the above display substrate according to the embodiments of the disclosure, the refractive index of the first light extraction layer and the refractive index of the second light extraction layer are respectively 1.8-2.5, and the refractive index of the second electrode is 1.4-1.6.

Optionally, in the above display substrate according to the embodiments of the disclosure, a thickness of the first light extraction layer and a thickness of the second light extraction layer are respectively greater than a thickness of the second electrode in a direction perpendicular to the base substrate.

Optionally, in the above display substrate according to the embodiments of the disclosure, the thickness of the first light extraction layer is equal to the thickness of the second light extraction layer.

Optionally, in the above display substrate according to the embodiments of the disclosure, the thicknesses of the first light extraction layer and the thickness of the second light extraction layer are 12 nm-60 nm, and the thickness of the second electrode is 10 nm-14 nm.

Optionally, in the above display substrate according to the embodiments of the disclosure, the plurality of sub-pixel regions includes a first sub-pixel region, a second sub-pixel region and a third sub-pixel region; wherein:
  each of the first sub-pixel region, the second sub-pixel region and the third sub-pixel region has one opening area; and the first sub-pixel region, the second sub-pixel region and the third sub-pixel region are of regular hexagons;
  the first sub-pixel region, the second sub-pixel region and the third sub-pixel region form a repeating unit, and are arranged circularly in a row direction;
  sub-pixel regions of odd rows are aligned in a column direction, sub-pixel regions of even rows are aligned in the column direction, and the sub-pixel regions of odd rows and the sub-pixel regions of even rows are staggered by half of the sub-pixel region in the row direction; and
  the first light extraction layer is arranged in non-opening areas overlapped in three sub-pixel regions in two adjacent rows.

Optionally, in the above display substrate according to the embodiments of the disclosure, the three sub-pixel regions include: two adjacent sub-pixel regions in a previous row and one sub-pixel region in a latter row among sub-pixel regions in two adjacent rows.

Optionally, in the above display substrate according to the embodiments of the disclosure, the three sub-pixel regions include: two adjacent sub-pixel regions in a previous row and one sub-pixel region in a latter row among sub-pixel regions in two adjacent rows; and two adjacent sub-pixel regions in a latter row and one sub-pixel region in a previous row among sub-pixel regions in two adjacent rows;
  the first light extraction layer includes a first part and a second part; wherein the first part is arranged in the two adjacent sub-pixel regions in the previous row and the one sub-pixel region in the latter row; and the second part is arranged in the two adjacent sub-pixel regions in the latter row and the one sub-pixel region in the previous row.

Optionally, in the above display substrate according to the embodiments of the disclosure, the plurality of sub-pixel regions includes a first sub-pixel region, a second sub-pixel region and a third sub-pixel region; wherein:
  each of the first sub-pixel region, the second sub-pixel region and the third sub-pixel region has one opening area; the third sub-pixel region and the second sub-pixel region are respectively squares, and the first sub-pixel region is a rectangle;

the third sub-pixel region and the second sub-pixel region are arranged alternately in a column direction, a column where the first sub-pixel region is located and a column where the third sub-pixel region and the second sub-pixel region are located are arranged alternately in a row direction, and one first sub-pixel region is arranged in contact with two third sub-pixel regions and two second sub-pixel regions in one column; and the first light extraction layer is arranged in the non-opening area in the row direction between opening areas contained in every two columns of first sub-pixel regions.

Optionally, in the above display substrate according to the embodiments of the disclosure, the plurality of sub-pixel regions includes a first sub-pixel region, a second sub-pixel region and a third sub-pixel region; wherein:

each of the first sub-pixel region, the second sub-pixel region and the third sub-pixel region has one opening area; the third sub-pixel region and the second sub-pixel region are respectively squares, and the first sub-pixel region is a rectangle;

the third sub-pixel region and the second sub-pixel region are arranged alternately in a column direction, a column where the first sub-pixel region is located and a column where the third sub-pixel region and the second sub-pixel region are located are arranged alternately in a row direction, and one first sub-pixel region is arranged in contact with two third sub-pixel regions and two second sub-pixel regions in one column;

the first light extraction layer includes a first part and a second part; wherein the first part is arranged in the non-opening area between the opening area contained in the third sub-pixel region and the opening area contained in the second sub-pixel region; a width of the first part, a width of the opening area contained in the third sub-pixel region and a width of the opening area contained in the second sub-pixel region are equal in the row direction; the second part is arranged in the non-opening area between the opening area contained in the first sub-pixel region and the opening area contained in the third sub-pixel region, and the non-opening area between the opening area contained in the second sub-pixel region and the opening area contained in the first sub-pixel region.

Optionally, in the above display substrate according to the embodiments of the disclosure, the plurality of sub-pixel regions includes a first sub-pixel region, a second sub-pixel region and a third sub-pixel region; wherein:

each of the first sub-pixel region and the second sub-pixel region has one opening area, and the third sub-pixel region has two opening areas; and the first sub-pixel region, the second sub-pixel region and the third sub-pixel region are respectively of hexagons that are non-regular polygons;

the first sub-pixel region, the second sub-pixel region and the third sub-pixel region form a repeating unit, and are arranged circularly in a row direction;

sub-pixel regions of odd rows are aligned in a column direction, sub-pixel regions of even rows are aligned in the column direction, and the sub-pixel regions of odd rows and the sub-pixel regions of even rows are staggered by half of the sub-pixel region in the row direction; and the first light extraction layer is arranged in the non-opening area between the opening areas contained in every two adjacent first sub-pixel region and second sub-pixel region, the non-opening area between the opening areas contained in every two adjacent second sub-pixel region and third sub-pixel region, and the non-opening area between the opening areas contained in every two adjacent third sub-pixel region and first sub-pixel region.

Optionally, in the above display substrate according to the embodiments of the disclosure, the plurality of sub-pixel regions includes a first sub-pixel region, a second sub-pixel region and a third sub-pixel region; wherein:

the third sub-pixel region has two opening areas, and each of the first sub-pixel region and the second sub-pixel region has one opening area; and the first sub-pixel region, the second sub-pixel region and the third sub-pixel region are respectively of hexagons that are non-regular polygons;

the first sub-pixel region, the second sub-pixel region and the third sub-pixel region form a repeating unit, and are arranged circularly in a row direction;

sub-pixel regions of odd rows are aligned in a column direction, sub-pixel regions of even rows are aligned in the column direction, and the sub-pixel regions of odd rows and the sub-pixel regions of even rows are staggered by half of the sub-pixel region in the row direction; and the first light extraction layer includes a first part and a second part; wherein the first part is arranged in the non-opening area between the opening areas contained in every two adjacent sub-pixel regions in the row direction, and a length of the first part in the column direction is equal to a length of the first sub-pixel region and a length of the second sub-pixel region; and the second part is arranged in the non-opening area where the first sub-pixel region and the third sub-pixel region in a same row are overlapped with the second sub-pixel region in an adjacent row.

Optionally, in the above display substrate according to the embodiments of the disclosure, the plurality of sub-pixel regions includes a first sub-pixel region, a second sub-pixel region and a third sub-pixel region; wherein:

each of the first sub-pixel region, the second sub-pixel region and the third sub-pixel region has one opening area; the first sub-pixel region and the second sub-pixel region are respectively of squares, and the third sub-pixel region is of a rectangle;

the first sub-pixel region and the second sub-pixel region are alternately arranged in an odd row, and the third sub-pixel region is arranged in an even row; sub-pixel regions of odd rows are aligned in a column direction, sub-pixel regions of even rows are aligned in the column direction, and the sub-pixel regions of odd rows and the sub-pixel regions of even rows are staggered by half of the sub-pixel region in the row direction; and the first light extraction layer is arranged in the non-opening area in the row direction and column direction between opening areas contained in every two adjacent sub-pixel regions.

Optionally, in the above display substrate according to the embodiments of the disclosure, the plurality of sub-pixel regions includes a first sub-pixel region, a second sub-pixel region and a third sub-pixel region; wherein:

each of the first sub-pixel region, the second sub-pixel region and the third sub-pixel region has one opening area; the first sub-pixel region and the second sub-pixel region are respectively of squares, and the third sub-pixel region is of a rectangle;

the first sub-pixel region and the second sub-pixel region are alternately arranged in an odd row, and the third sub-pixel region is arranged in an even row; sub-pixel regions of odd rows are aligned in a column direction, sub-pixel regions of even rows are aligned in the column direction, and the sub-pixel regions of odd rows and the sub-pixel regions of even rows are staggered by half of the sub-pixel region in the row direction; and the first light extraction layer includes a first part and a second part; wherein the first part is arranged in the non-opening area between the opening area contained in the third sub-pixel region and the opening area contained in the second sub-pixel region, and the second part is arranged in the non-opening area between the opening area contained in the third sub-pixel region and the opening area contained in the first sub-pixel region.

Optionally, in the above display substrate according to the embodiments of the disclosure, centers of the first light extraction layer in the non-opening areas are collinearly arranged in a same row direction, and centers of the first light extraction layer in the non-opening areas are collinearly arranged in a same column direction.

Optionally, in the above display substrate according to the embodiments of the disclosure, materials of the first light extraction layer and the second light extraction layer are one or a combination of non-semiconductor metal oxide, semiconductor metal oxide, and organic small molecular material.

Optionally, in the above display substrate according to the embodiments of the disclosure, the non-semiconductor metal oxide includes: aluminum trioxide and/or magnesium oxide; the semiconductor metal oxide includes one or a combination of zinc oxide, molybdenum trioxide, vanadium pentoxide or tungsten trioxide; and a refractive index of the organic small molecular material is greater than 2.

In another aspect, embodiments of the disclosure provide a display apparatus, including the above display substrate.

In another aspect, embodiments of the disclosure provide a mask plate configured to manufacture the first light extraction layer described above;

the mask plate includes a light-transmitting area and a non-light-transmitting area; wherein a pattern of the light-transmitting area is same as a pattern of the first light extraction layer, and a pattern of the non-light-transmitting area is complementary to the pattern of the light-transmitting area.

DETAILED DESCRIPTION OF THE EMBODIMENTS

Figure 1:
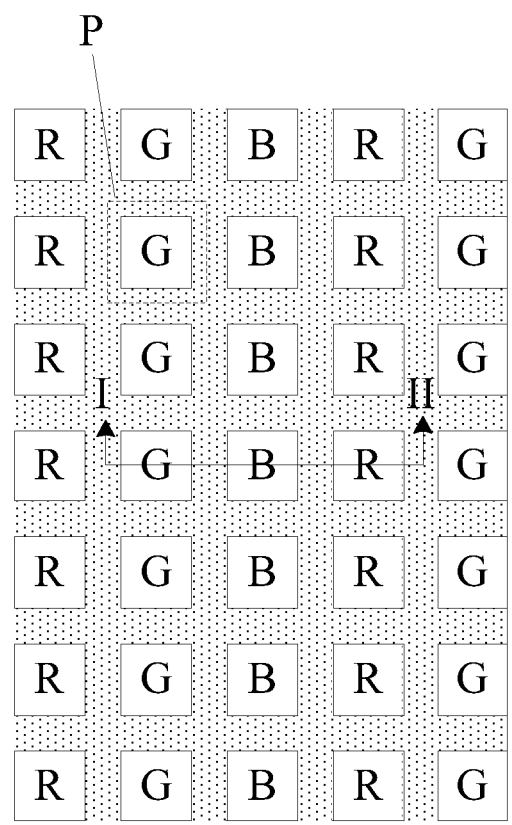
FIG. 1 is a schematic structural diagram of a display substrate according to an embodiment of the disclosure.

In order to make the purposes, technical solutions and advantages of the disclosure clearer, the technical solutions of the embodiments of the disclosure will be described clearly and completely below in combination with the accompanying drawings of the embodiments of the disclosure. It is necessary to note that the size and shape of each diagram in the accompanying drawings do not reflect the true proportion, and are merely for purpose of schematically illustrating the content of the disclosure. Also, the same or similar reference numbers represent the same or similar elements or the elements having the same or similar functions. Obviously the described embodiments are a part of the embodiments of the disclosure but not all the embodiments. Based upon the embodiments of the disclosure, all of other embodiments obtained by those ordinary skilled in the art without creative work pertain to the protection scope of the disclosure.

Unless otherwise defined, the technical or scientific terms used here shall have the general meaning understood by those ordinary skilled in the art to which the disclosure belongs. The "first", "second" and similar words used in the specification and claims of the disclosure do not represent any order, number or importance, and are only used to distinguish different components. The word such as "include" or "contain" or the like means that the element or object appearing before this word encompasses the elements or objects and their equivalents listed after this word, without excluding other elements or objects. The words such as "inner", "outer", "up", "down" are only used to represent the relative position relationship. When the absolute position of a described object changes, the relative position relationship may also change accordingly.

Since the transparent display apparatus has a certain light transmittance, while observing a display image on the front of the transparent display apparatus, a user can see objects behind the transparent display apparatus through the transparent display apparatus; and when the user is at the back of the transparent display apparatus, he/she can see objects in front of the transparent display apparatus through the transparent display apparatus, thus enhancing the efficiency of information delivery and also adding a lot of fun, and bringing the user unprecedented visual feelings and brand-new experience. The transparent display apparatus is often used in the window exhibition hall, architectural window, automotive glass, human-computer interaction and other fields, and has a wide range of application prospects.

In the related art, an OLED transparent display apparatus has a plurality of sub-pixel regions. Each sub-pixel region is provided with one light-emitting device. Each light-emitting device includes an anode, a light-emitting layer and a cathode stacked. The electric field generated by the anode and the cathode drives the current carriers to move to the light-emitting layer to couple and emit light, so as to realize the image display. The cathodes of all light-emitting devices are arranged on the entire surface, and the anode of each light-emitting device is only located in the opening area of the sub-pixel region. The ambient light is transmitted through the gap between adjacent anodes (i.e., the non-opening area of the sub-pixel region) to show the objects in the actual environment. However, the cathodes provided on the entire surface reduce the transmittance of the product to a certain extent, and affect the transparent display effect of the product.

Figure 2:
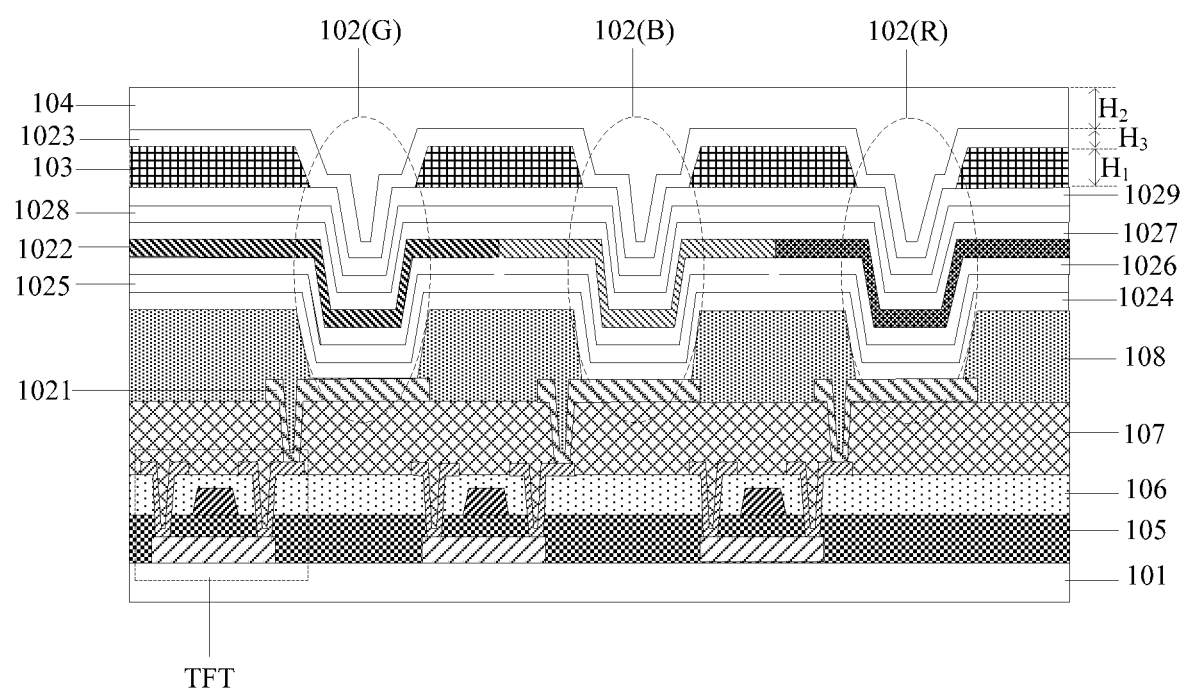
FIG. 2 is a schematic diagram of a cross-sectional structure along the line I-II in FIG. 1.

For the above technical problem in the related art, embodiments of the disclosure provide a display substrate, as shown in FIG. 1 and FIG. 2. The display substrate includes a base substrate 101, a plurality of light-emitting devices 102, a first light extraction layer 103, and a second light extraction layer 104.

The base substrate 101 includes a plurality of sub-pixel regions P. The sub-pixel region P includes an opening area (an area filled with no pattern in FIG. 1) and a non-opening area (i.e., a shaded area in FIG. 1).

The plurality of light-emitting devices 102 is located on the base substrate 101. The light-emitting device 102 includes a first electrode 1021, a light-emitting layer 1022 and a second electrode 1023 stacked. The first electrode 1021 and the light-emitting layer 1022 of each light-emitting device 102 are correspondingly arranged in one opening area. The second electrodes 1023 of all the light-emitting devices 102 form an integrated planar electrode.

The first light extraction layer 103 is located between the light-emitting layer 1022 and the second electrode 1023 and arranged in at least part of the non-opening area. A refractive index of the first light extraction layer 103 is greater than a refractive index of the second electrode 1023.

The second light extraction layer 104 is located on a side of the second electrode 1023 facing away from the first light extraction layer 103. An orthographic projection of the second light extraction layer 104 on the base substrate 101 completely covers an orthographic projection of the first light extraction layer 103 on the base substrate 101. A refractive index of the second light extraction layer 104 is greater than the refractive index of the second electrode 1023.

In the above display substrate according to embodiments of the disclosure, the first light extraction layer 103 and the second light extraction layer 104 are added on both sides of the second electrode 1023 in the non-opening area. The refractive indexes of the first light extraction layer 103 and the second optical layer 104 are set to be greater than the refractive index of the second electrode 1023 respectively, so that more light can be refracted at the interface between the second electrode 1023 and the first light extraction layer 103 and at the interface between the second electrode 1023 and the second light extraction layer 104, resulting in an increase in the transmittance of the non-opening area, so as to effectively improve the overall transmittance of the display apparatus.

In some embodiments, the type of the above-mentioned light-emitting device 102 may be top emission type or bottom emission type. When the light-emitting device 102 is of the top emission type, the first electrode 1021 is the anode and the second electrode 1023 is the cathode. When the light-emitting device 102 is of the bottom emission type, the first electrode 1021 is the cathode and the second electrode 1023 is the anode. The disclosure is illustrated in the case that the light-emitting device 102 is of the top emission type as an example.

In some embodiments, as shown in FIG. 2, the light-emitting device 102 may further include: a hole injection layer 1024, a hole transport layer 1025, an electron blocking layer 1026, a hole blocking layer 1027, an electron transport layer 1028, and an electron injection layer 1029. The light-emitting device 102 may be a red light-emitting device R, a green light-emitting device G or a blue light-emitting device B. The light-emitting device 102 may also be a white light-emitting device W, which is not limited here. Furthermore, the display substrate may further include: a transistor TFT, a gate insulation layer 105, an interlayer dielectric layer 106, a planarization layer 107 and a pixel definition layer 108, etc. All of other indispensable components of the display substrate should be understood by those ordinary skilled in the art to be included, and will be omitted here and should not be considered as limitations on the disclosure.

It should be noted that, in the above display substrate according to embodiments of the disclosure, the deposition process of the first light extraction layer 103 and the second light extraction layer 104 may be selectively selected according to the film forming form of the material, and may be vacuum evaporation or Atomic Layer Deposition (ALD), which is not limited here. Moreover, the process of forming the pattern of the first light extraction layer 103 may not only include some or all of deposition, photoresist coating, masking of mask plate, exposure, development, etching, photoresist stripping and others, but also include other processing processes, which are subject to the desired patterns formed in the actual manufacturing process, and which are not limited here. For example, the post-baking process may also be included after development and before etching.

Optionally, in the above display substrate according to the embodiments of the disclosure, as shown in FIG. 2, the second light extraction layer 104 may be arranged on an entire surface of the second electrode 1023, to simplify the manufacturing process.

Optionally, in the above display substrate according to the embodiments of the disclosure, the refractive index of the first light extraction layer 103 and the refractive index of the second light extraction layer 104 may be respectively 1.8-2.5, and the refractive index of the second electrode 1023 may be 1.4-1.6, so as to better improve the transmittance.

In some embodiments, the materials of the first light extraction layer 103 and the second light extraction layer 104 may be selected from one or any combination of non-semiconductor metal oxide, semiconductor metal oxide, and organic small molecular material. Optionally, the non-semiconductor metal oxide may include: aluminum trioxide ($Al_2O_3$) and/or magnesium oxide (MgO). The semiconductor metal oxide may include one or a combination of zinc oxide (ZnO), molybdenum trioxide ($MoO_3$), vanadium pentoxide ($V_2O_5$) and tungsten trioxide ($WO_3$). A refractive index of the organic small molecular material is greater than 2. The material of the second electrode 1023 may be selected from magnesium-silver alloy (Mg:Ag), silver (Ag), aluminum (Al), calcium (Ca), etc.

Exemplarily, both the first light extraction layer 103 and the second light extraction layer 104 are made of zinc oxide (ZnO) material, and the second electrode 1023 is made of silver (Ag), forming the stacked layers of ZnO/Ag/ZnO to improve the transmittance of the non-opening area. Also, the second electrode 1023 uses a pure metal thin layer, so the stacked layers of ZnO/Ag/ZnO can effectively reduce the surface resistance and voltage drop (IR Drop) of the second electrode 1023. In some embodiments, both the first light extraction layer 103 and the second light extraction layer 104 are made of aluminum trioxide ($Al_2O_3$) material, and the second electrode 1023 is made of magnesium-silver alloy (Mg:Ag) with a mass ratio of 1:9, forming the stacked layers of $Al_2O_3$/Mg:Ag/$Al_2O_3$ to improve the transmittance of the non-opening area.

Optionally, in the above display substrate according to the embodiments of the disclosure, as shown in FIG. 2, in order to further improve the transmittance, a thickness $H_1$ of the first light extraction layer 103 and a thickness $H_2$ of the second light extraction layer 104 in the non-opening area may be set to be respectively greater than a thickness $H_3$ of the second electrode 1023 in a direction perpendicular to the base substrate 101.

In some embodiments, the thickness $H_1$ of the first light extraction layer 103 may be equal to the thickness of the second light extraction layer 104. It should be noted that, in the actual process, due to limitations of process conditions or other factors, the above "equal" may be completely equivalent, or there may be some deviation. Therefore, the "equal" relationship between the above features belongs to the protection scope of the disclosure as long as the relationship satisfies the tolerance of error.

Optionally, in the above display substrate according to the embodiments of the disclosure, the thickness $H_1$ of the first light extraction layer 103 and the thickness $H_2$ of the second light extraction layer 104 may be 12 nm-60 nm, and the thickness $H_3$ of the second electrode 1023 may be 10 nm-14 nm.

Figure 3:
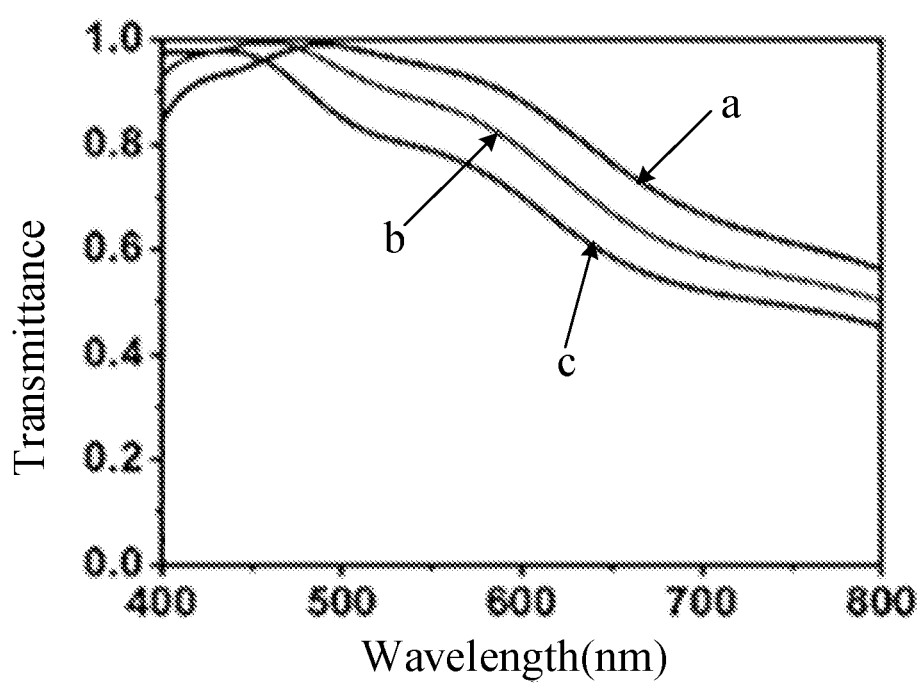
FIG. 3 is a curve diagram of the transmittance of the display apparatus according to an embodiment of the disclosure.

Exemplarily, FIG. 3 shows a curve graph of the transmittance of the display apparatus when the material of the first light extraction layer 103 and the second light extraction layer 104 is zinc oxide (ZnO) and the material of the second electrode 1023 is silver (Ag). In FIG. 3, the thickness $H_3$ of the second electrode 1023 is 10 nm, the curve 'a' corresponds to the case where the thickness $H_1$ of the first light extraction layer 103 and the thickness $H_2$ of the second light extraction layer 104 are both 17 nm, the curve 'b' corresponds to the case where the thickness $H_1$ of the first light extraction layer 103 and the thickness $H_2$ of the second light extraction layer 104 are both 12 nm, and the curve 'c' corresponds to the case where the thickness $H_1$ of the first light extraction layer 103 and the thickness $H_2$ of the second light extraction layer 104 are both 7.5 nm. As can be seen from FIG. 3, when the thickness $H_1$ of the first light extraction layer 103 and the thickness $H_2$ of the second light extraction layer 104 reach 17 nm, the transmittance of the RGB band can reach more than 80%. The greater the thickness $H_1$ of the first light extraction layer 103 the thickness $H_2$ of the second light extraction layer 104, the higher the transmittance.

Optionally, in the above display substrate according to the embodiments of the disclosure, the patterns of the first light extraction layers 103 may vary with different sub-pixel regions P. Moreover, in implementations, a Fine Metal Mask (FMM) with regular openings or special-shaped openings may be used to form the patterns of the first light extraction layers 103, or two or more FMMs with regular openings or special-shaped openings may be used to cooperate to form the patterns of the first light extraction layers 103.

Figure 4:
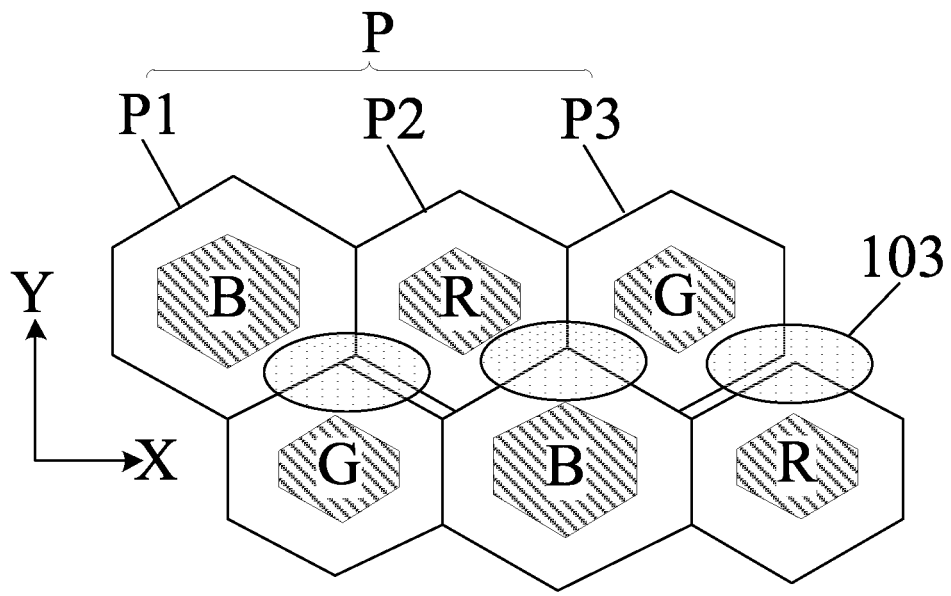
FIG. 4 is a schematic structural diagram of a first light extraction layer according to an embodiment of the disclosure.
Figure 5:
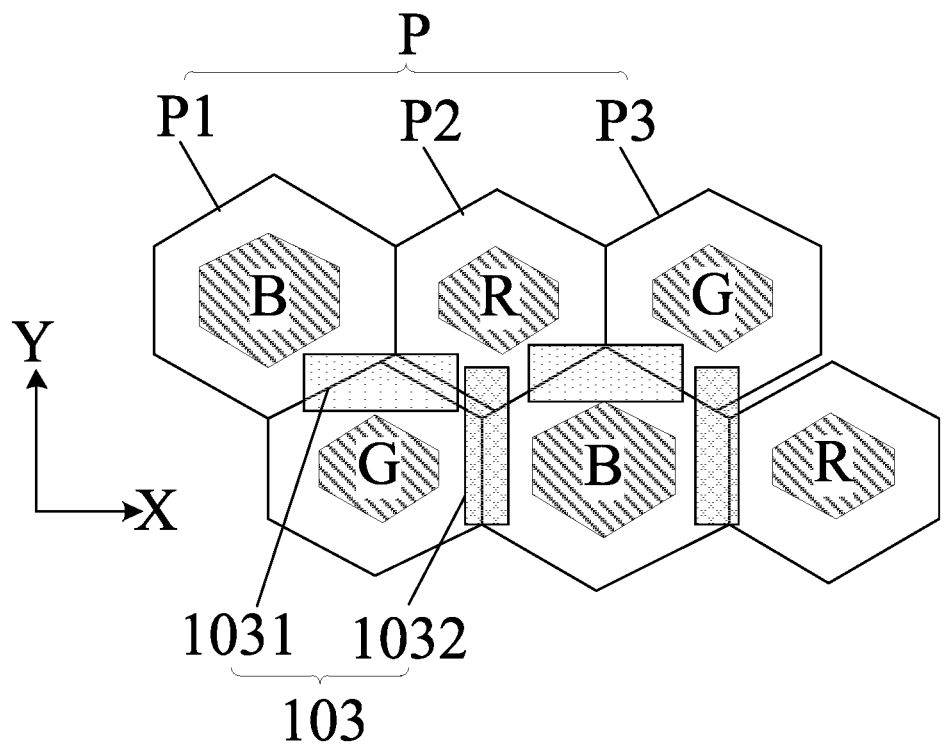
FIG. 5 is another schematic structural diagram of the first light extraction layer according to an embodiment of the disclosure.

Optionally, in the above display substrate according to the embodiments of the disclosure, as shown in FIG. 4 and FIG. 5, the plurality of sub-pixel regions P include a first sub-pixel region P1, a second sub-pixel region P2 and a third sub-pixel region P3. Each of the first sub-pixel region P1, the second sub-pixel region P2 and the third sub-pixel region P3 has one opening area. The first sub-pixel region P1, the second sub-pixel region P2 and the third sub-pixel region P3 are regular hexagons. The first sub-pixel region P1, the second sub-pixel region P2 and the third sub-pixel region P3 form a repeating unit. The repeating units are arranged circularly in a row direction X. Sub-pixel regions P of odd rows are aligned in a column direction Y, sub-pixel regions P of even rows are aligned in the column direction Y, and the sub-pixel regions P of odd rows and the sub-pixel regions P of even rows are staggered by half of the sub-pixel region P in the row direction X. The first light extraction layer 103 may be arranged in a non-opening area lapped by three sub-pixel regions P in two adjacent rows. That is, the plurality of sub-pixel regions P are arranged in a "Δ" (delta) manner.

In some embodiments, as shown in FIG. 4, the three sub-pixel regions P include: two adjacent sub-pixel regions P (for example, the first sub-pixel region P1 and the second sub-pixel region P2) in a previous row of the two adjacent rows and one sub-pixel region P (for example, the third sub-pixel region P3) in a latter row of the two adjacent rows. In such a case, one mask plate can be used to form the pattern of the first light extraction layer 103.

In some other embodiments, as shown in FIG. 5, the three sub-pixel regions P may include: two adjacent sub-pixel regions P (for example, the first sub-pixel region P1 and the second sub-pixel region P2) in a previous row of the two adjacent rows and one sub-pixel region P (for example, the third sub-pixel region P3) in a latter row of the two adjacent rows; and two adjacent sub-pixel regions P (for example, the first sub-pixel region P1 and the third sub-pixel region P3) in a latter row of the two adjacent rows and one sub-pixel region P (for example, the second sub-pixel region P2) in a previous row of the two adjacent rows. The first light extraction layer 103 may include a first part 1031 and a second part 1032. The first part 1031 is arranged in the two adjacent sub-pixel regions P in the previous row and the one sub-pixel region P in the latter row. The second part is arranged in the two adjacent sub-pixel regions P in the latter row and the one sub-pixel region P in the previous row. In such a case, one mask plate can be used to form the pattern of the first part 1031, and another mask plate can be used to form the pattern of the second part 1032. That is, two mask plates are used to cooperate to form the pattern of the first light extraction layer 103.

Figure 6:
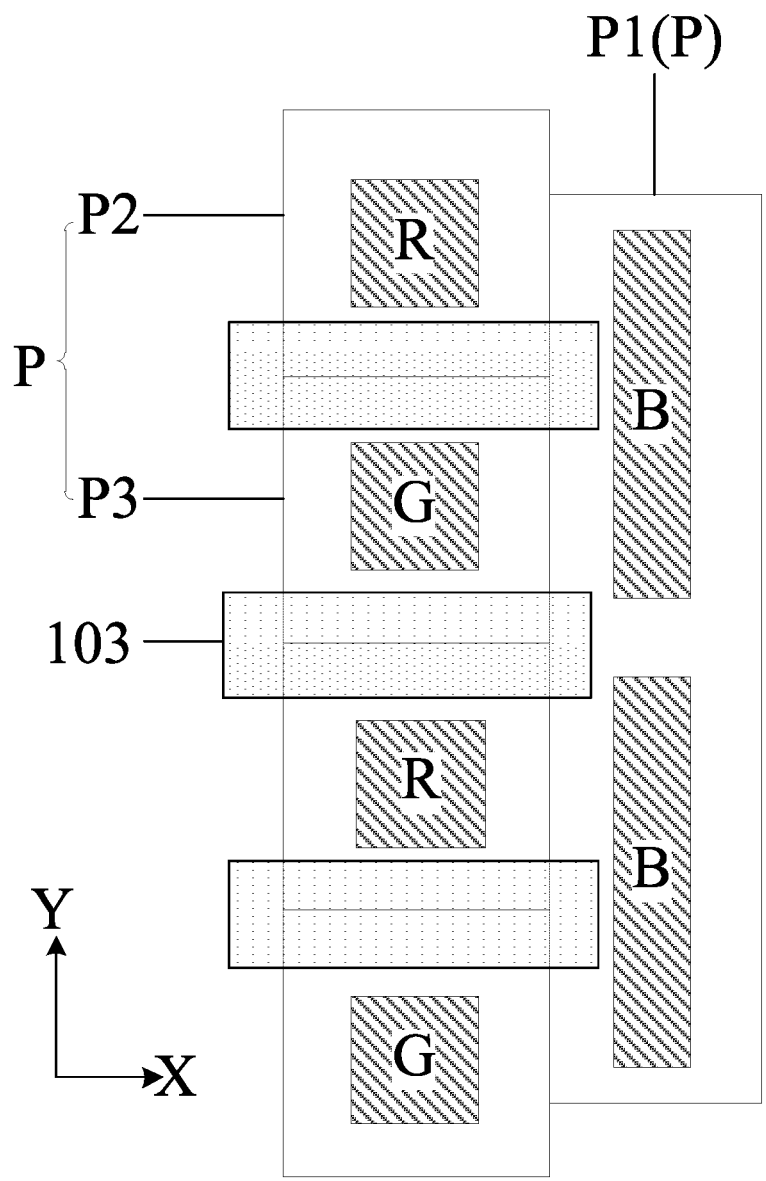
FIG. 6 is another schematic structural diagram of the first light extraction layer according to an embodiment of the disclosure.
Figure 7:
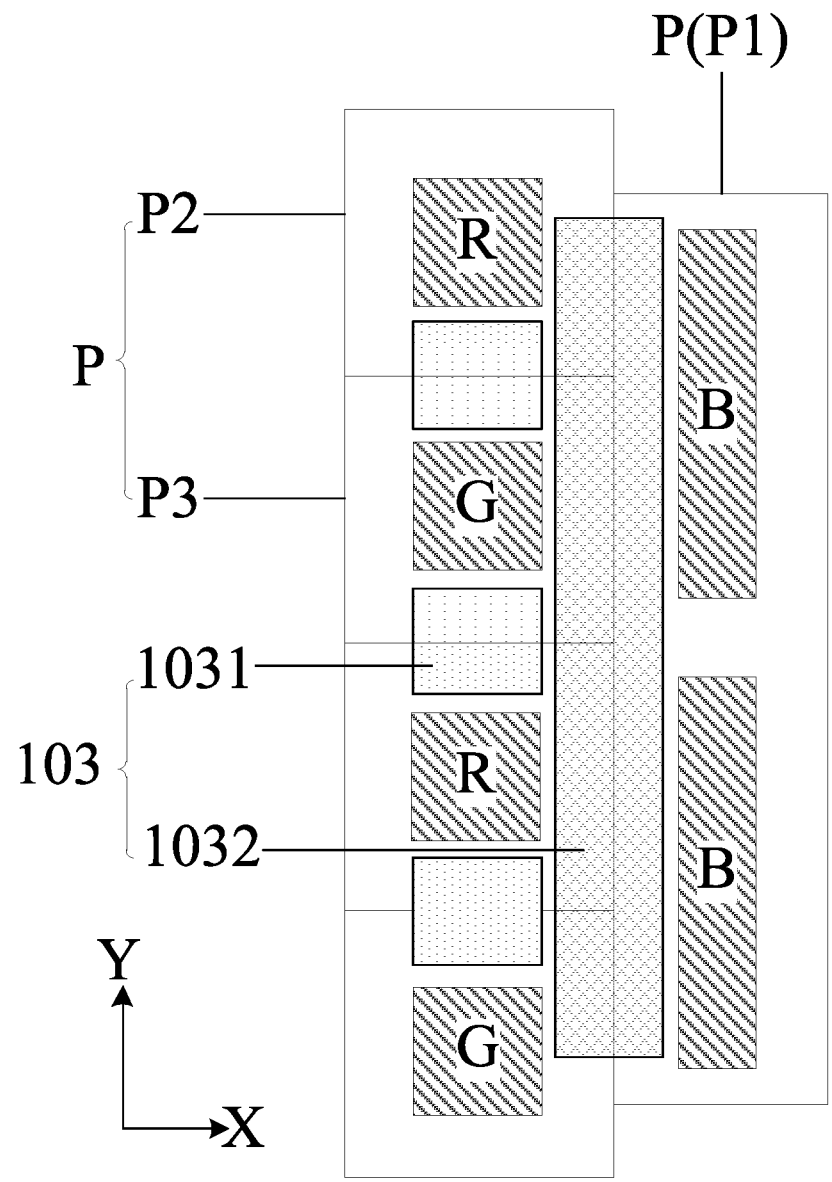
FIG. 7 is another schematic structural diagram of the first light extraction layer according to an embodiment of the disclosure.

Optionally, in the above display substrate according to the embodiments of the disclosure, as shown in FIG. 6 and FIG. 7, the plurality of sub-pixel regions P include a first sub-pixel region P1, a second sub-pixel region P2 and a third sub-pixel region P3. Each of the first sub-pixel region P1, the second sub-pixel region P2 and the third sub-pixel region P3 has an opening area. The third sub-pixel region P3 and the second sub-pixel region P2 are respectively squares, and the first sub-pixel region P1 is a rectangle. The third sub-pixel region P3 and the second sub-pixel region P2 are arranged alternately in a column direction Y. A column where the first sub-pixel region P1 is located and a column where the third sub-pixel region P3 and the second sub-pixel region P2 are located are arranged alternately in a row direction X. One first sub-pixel region P1 is arranged in contact with two third sub-pixel regions P3 and two second sub-pixel regions P2 in one column. That is, the plurality of sub-pixel regions P are arranged in the sRGB manner.

For example, in FIG. 6, the first light extraction layer 103 is arranged in the non-opening area in the row direction between opening areas contained in every two columns of first sub-pixel regions P1. In such a case, one mask plate can be used to form the pattern of the first light extraction layer 103. In FIG. 7, the first light extraction layer 103 includes a first part 1031 and a second part 1032. The first part 1031 is arranged in the non-opening area between the opening area contained in the third sub-pixel region P3 and the opening area contained in the second sub-pixel region P2. A width of the first part 1031, a width of the opening area contained in the third sub-pixel region P3 and a width of the opening area contained in the second sub-pixel region P2 are equal in the row direction X. The second part 1032 is arranged in the non-opening area between the opening area contained in the first sub-pixel region P1 and the opening area contained in the third sub-pixel region P3, and the non-opening area between the opening area contained in the second sub-pixel region P2 and the opening area contained in the first sub-pixel region P1. In such a case, one mask plate can be used to form the pattern of the first part 1031, and another mask plate can be used to form the pattern of the second part 1032. That is, two mask plates are used to cooperate to form the pattern of the first light extraction layer 103.

Figure 8:
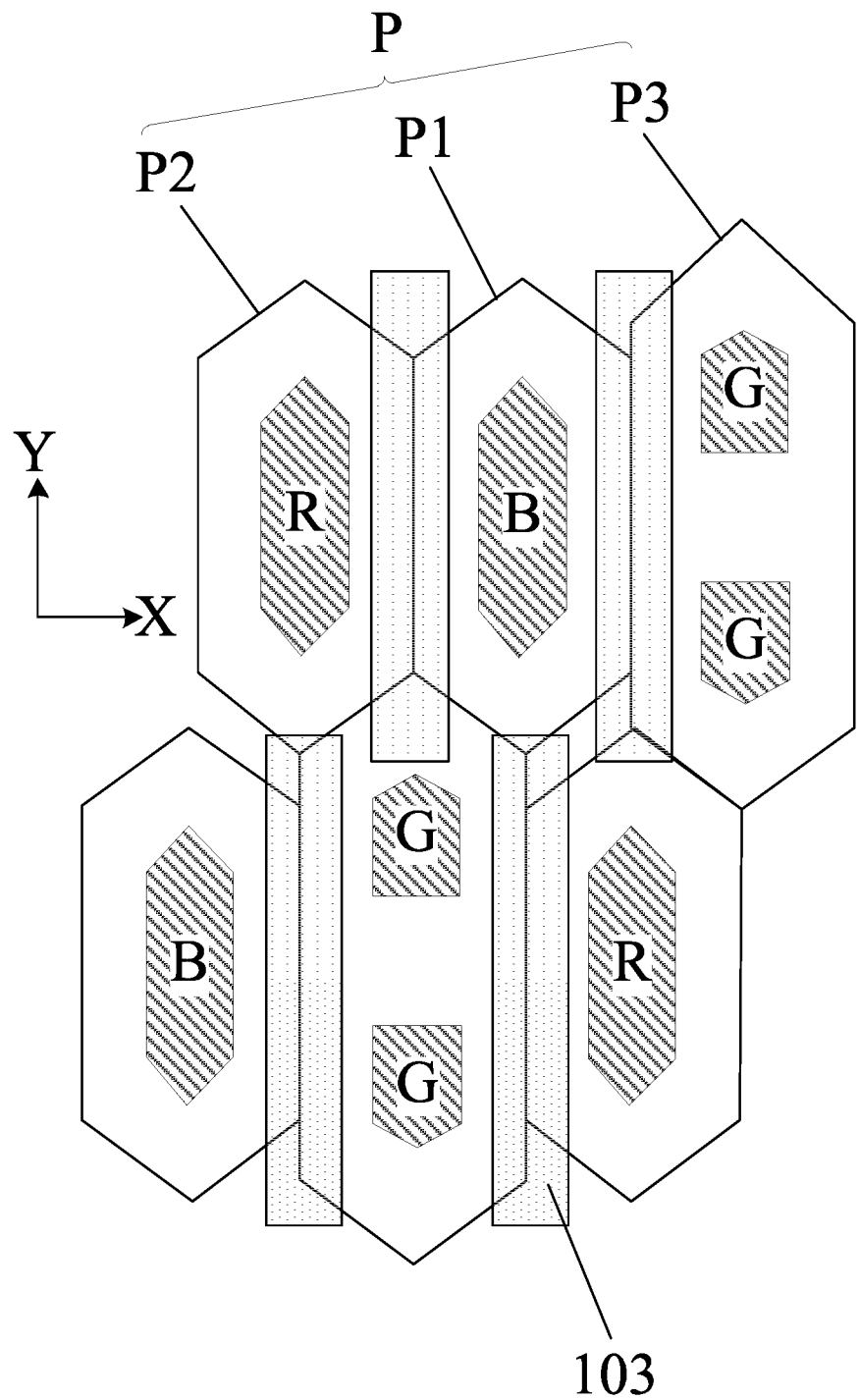
FIG. 8 is another schematic structural diagram of the first light extraction layer according to an embodiment of the disclosure.
Figure 9:
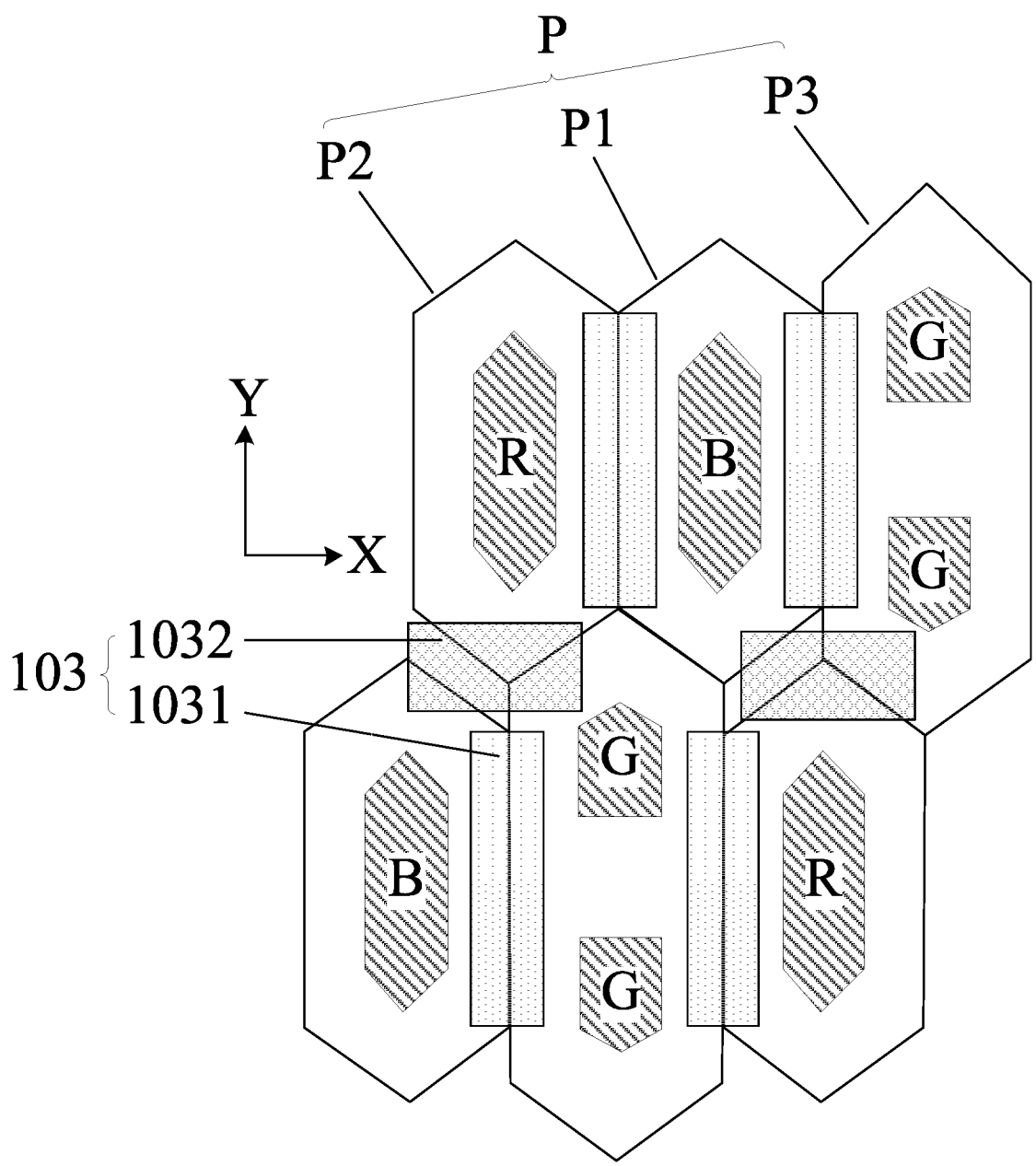
FIG. 9 is another schematic structural diagram of the first light extraction layer according to an embodiment of the disclosure.

Optionally, in the above display substrate according to the embodiments of the disclosure, as shown in FIG. 8 and FIG. 9, the plurality of sub-pixel regions P include a first sub-pixel region P1, a second sub-pixel region P2 and a third sub-pixel region P3. Each of the first sub-pixel region P1 and the second sub-pixel region P2 has one opening area, and the third sub-pixel region P3 has two opening areas. The first sub-pixel region P1, the second sub-pixel region P2 and the third sub-pixel region P3 are respectively hexagons that are non-regular polygons. The first sub-pixel region P1, the second sub-pixel region P2 and the third sub-pixel region P3 form a repeating unit and are arranged circularly in a row direction X. Sub-pixel regions P of odd rows are aligned in a column direction Y, sub-pixel regions P of even rows are aligned in the column direction Y, and the sub-pixel regions P of odd rows and the sub-pixel regions P of even rows are staggered by half of the sub-pixel region P in the row direction X, so that the plurality of sub-pixel regions P form a GGRB pixel arrangement.

For example, in FIG. 8, the first light extraction layer 103 is arranged in the non-opening area between the opening areas contained in every two adjacent first sub-pixel region P1 and second sub-pixel region P2, the non-opening area between the opening areas contained in every two adjacent second sub-pixel region P2 and third sub-pixel region P3, and the non-opening area between the opening areas contained in every two adjacent third sub-pixel region P3 and first sub-pixel region P1. In such a case, one mask plate can be used to form the pattern of the first light extraction layer 103.

In FIG. 9, the first light extraction layer 103 includes a first part 1031 and a second part 1032. The first part 1031 is arranged in the non-opening area between the opening areas contained in every two adjacent sub-pixel regions P in the row direction. A length of the first part 1031 in the column direction Y is equal to a length of the first sub-pixel region P1 and a length of the second sub-pixel region P2. The second part 1032 is arranged in the non-opening area where the first sub-pixel region P1 and the third sub-pixel region P3 in a same row are overlapped with the second sub-pixel region P2 in an adjacent row. In such a case, one mask plate can be used to form the pattern of the first part 1031, and another mask plate can be used to form the pattern of the second part 1032. That is, two mask plates are used to cooperate to form the pattern of the first light extraction layer 103.

Figure 10:
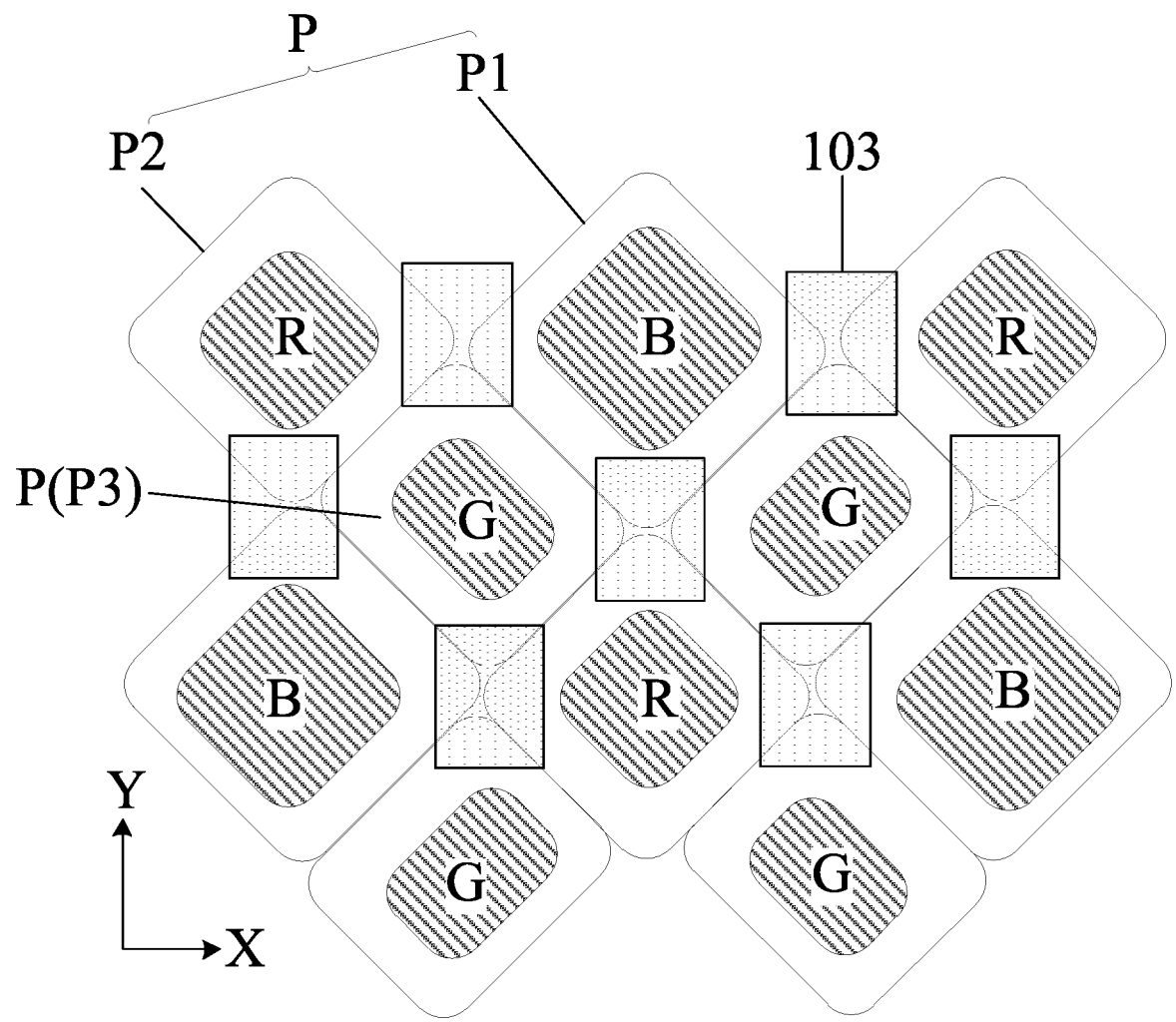
FIG. 10 is another schematic structural diagram of the first light extraction layer according to an embodiment of the disclosure.
Figure 11:
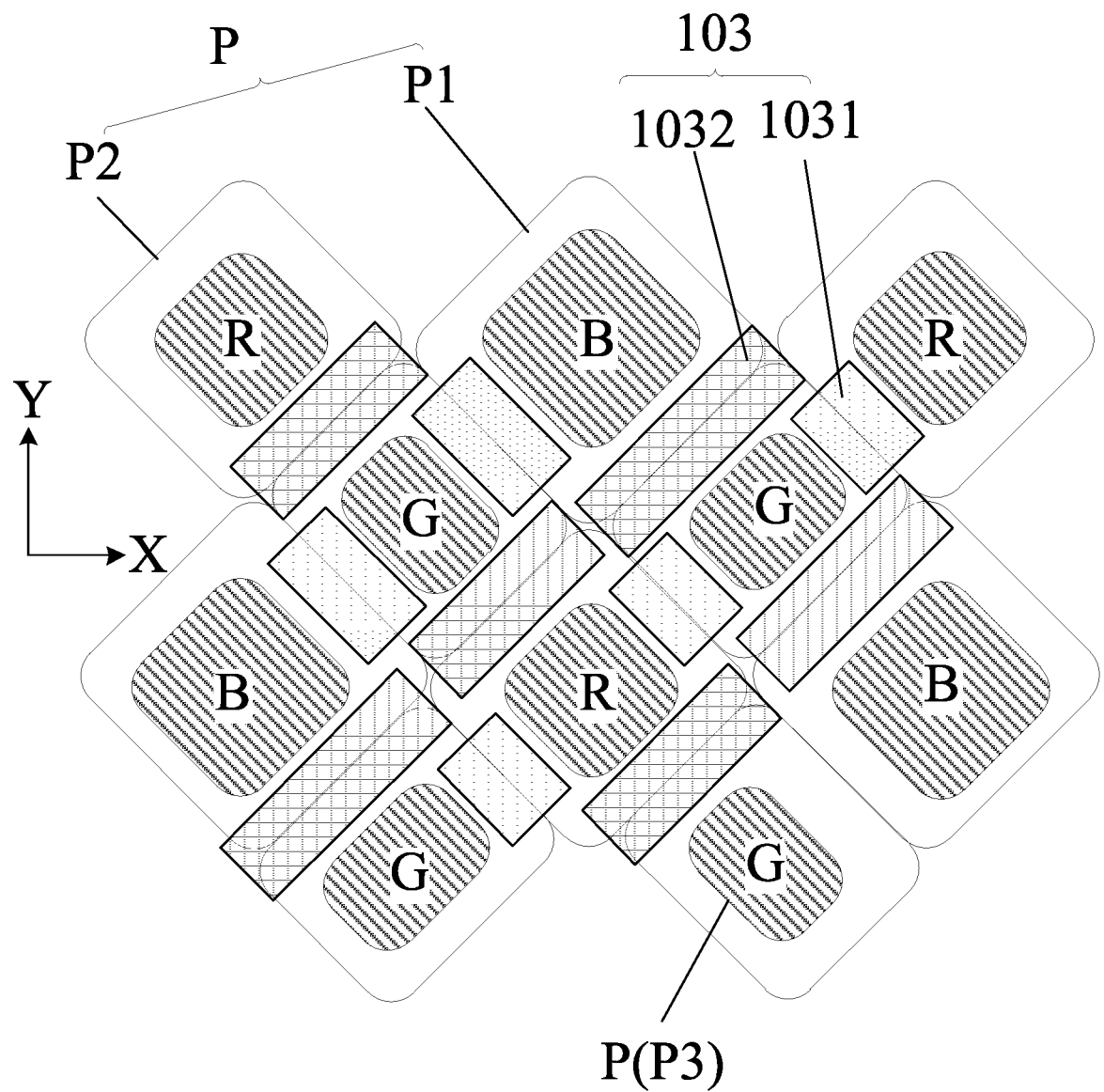
FIG. 11 is another schematic structural diagram of the first light extraction layer according to an embodiment of the disclosure.

Optionally, in the above display substrate according to the embodiments of the disclosure, as shown in FIG. 10 and FIG. 11, the plurality of sub-pixel regions P include a first sub-pixel region P1, a second sub-pixel region P2 and a third sub-pixel region P3. Each of the first sub-pixel region P1, the second sub-pixel region P2 and the third sub-pixel region P3 has one opening area. The first sub-pixel region P1 and the second sub-pixel region P2 are respectively squares, and the third sub-pixel region P3 is a rectangle. The first sub-pixel region P1 and the second sub-pixel region P2 are alternately arranged in an odd row, and the third sub-pixel region P3 is arranged in an even row. Sub-pixel regions P of odd rows are aligned in a column direction Y, sub-pixel regions P of even rows are aligned in the column direction Y, and the sub-pixel regions P of odd rows and the sub-pixel regions P of even rows are staggered by half of the sub-pixel region P in the row direction X, so that the plurality of sub-pixel regions P are arranged in the shape of diamond.

For example, in FIG. 10, the first light extraction layer 103 is arranged in the non-opening area in the row direction X and column direction Y between opening areas contained in every two adjacent sub-pixel regions P. In such a case, one mask plate can be used to form the pattern of the first light extraction layer 103. In FIG. 11, the first light extraction layer 103 includes a first part 1031 and a second part 1032. The first part 1031 is arranged in the non-opening area between the opening area contained in the third sub-pixel region P3 and the opening area contained in the second sub-pixel region P2, and the second part 1032 is arranged in the non-opening area between the opening area contained in the third sub-pixel region P3 and the opening area contained in the first sub-pixel region P1. In such a case, one mask plate can be used to form the pattern of the first part 1031, and another mask plate can be used to form the pattern of the second part 1032. That is, two mask plates are used to cooperate to form the pattern of the first light extraction layer 103.

It should be understood that, in order to save the cost of the mask plates, one mask plate may be preferably used to complete the fabrication of the first light extraction layer 103. Furthermore, in the disclosure, the first sub-pixel region P1 may be provided with a blue light-emitting device B, the second sub-pixel region P1 may be provided with a red light-emitting device R, and the third sub-pixel region P3 may be provided with a green light-emitting device G.

Optionally, in the above display substrate according to the embodiments of the disclosure, in order to make the pattern of the first light extraction layer 103 have approximately the same area in each sub-pixel region P and thus make the light transmittance more uniform, centers of the first light extraction layer 103 in the non-opening areas may be collinearly arranged in a same row direction X, and centers of the first light extraction layer 103 in the non-opening areas may be collinearly arranged in a same column direction Y.

Based on the same inventive concept, embodiments of the disclosure further provide a display apparatus including the above-mentioned display substrate according to the embodiments of the disclosure. Since the principle of the display apparatus to solve the problem is similar to the principle of the above-mentioned display substrate to solve the problem, so the implementations of the display apparatus can refer to the embodiments of the above-mentioned display substrate, and the repeated description thereof will be omitted.

In some embodiments, the above-mentioned display apparatus may be: mobile phone, tablet computer, television, display, notebook computer, digital photo frame, navigator, smart watch, fitness wristband, personal digital assistant, and any other product or component with display function. All of other indispensable components of the display apparatus should be understood by those ordinary skilled in the art to be included, and will be omitted here and should not be considered as limitations on the disclosure.

Based on the same inventive concept, embodiments of the disclosure provide a mask plate configured to manufacture the first light extraction layer.

The mask plate includes a light-transmitting area and a non-light-transmitting area. A pattern of the light-transmitting area is same as a pattern of the first light extraction layer, and a pattern of the non-light-transmitting area is complementary to the pattern of the light-transmitting area.

It should be understood that, if the patterns of the non-light-transmitting areas are mutually independent, the mask plate may include a transparent substrate and a metal layer fabricated on the transparent substrate. The metal layer has an opening in the light-transmitting area, and the metal material is reserved in the non-light-transmitting area. If the pattern of the non-light-transmitting area is continuous, the mask plate can only be made of a metal layer. The metal layer has an opening in the light-transmitting area, and the metal material is reserved in the non-light-transmitting area.

Evidently, those skilled in the art can make various modifications and variations to the embodiments of the disclosure without departing from the spirit and scope of the embodiments of the disclosure. Thus, the disclosure is also intended to encompass these modifications and variations to the embodiments of the disclosure as long as these modifications and variations come into the scope of the claims of the disclosure and their equivalents.

What is claimed is:

1. A display substrate, comprising:
    a base substrate comprising:
        a plurality of sub-pixel regions;
        wherein the sub-pixel region comprises:
            an opening area; and
            a non-opening area;
    a plurality of light-emitting devices on the base substrate;
        wherein the light-emitting device comprises:
        a first electrode, a light-emitting layer and a second electrode stacked; and
        at least one or a combination of: a hole injection layer, a hole transport layer, an electron blocking layer, a hole blocking layer, an electron transport layer, or an electron injection layer;
        wherein the first electrode and the light-emitting layer of each light-emitting device are correspondingly arranged in one opening area, and the second electrodes of all the light-emitting devices form an integrated planar electrode;
    a first light extraction layer located between the light-emitting layer and the second electrode and arranged in at least part of the non-opening area, wherein an orthographic projection of the first light extraction layer on the base substrate does not overlap with the opening area, and a refractive index of the first light extraction layer is greater than a refractive index of the second electrode;
    a second light extraction layer located on a side of the second electrode away from the first light extraction layer, wherein an orthographic projection of the second light extraction layer on the base substrate completely covers an orthographic projection of the first light extraction layer on the base substrate, and a refractive index of the second light extraction layer is greater than the refractive index of the second electrode.

2. The display substrate according to claim 1, wherein the second light extraction layer is arranged on an entire surface of the second electrode.

3. The display substrate according to claim 1, wherein the refractive index of the first light extraction layer and the refractive index of the second light extraction layer are respectively 1.8-2.5, and the refractive index of the second electrode is 1.4-1.6.

4. The display substrate according to claim 1, wherein a thickness of the first light extraction layer and a thickness of the second light extraction layer are respectively greater than a thickness of the second electrode in a direction perpendicular to the base substrate.

5. The display substrate according to claim 4, wherein the thickness of the first light extraction layer is equal to the thickness of the second light extraction layer.

6. The display substrate according to claim 5, wherein the thicknesses of the first light extraction layer and the thickness of the second light extraction layer are 12 nm-60 nm, and the thickness of the second electrode is 10 nm-14 nm.

7. The display substrate according to claim 1, wherein the plurality of sub-pixel regions comprises:
    a first sub-pixel region,
    a second sub-pixel region, and
    a third sub-pixel region;
    wherein each of the first sub-pixel region, the second sub-pixel region and the third sub-pixel region has one opening area; and the first sub-pixel region, the second sub-pixel region and the third sub-pixel region are of regular hexagons;
    the first sub-pixel region, the second sub-pixel region and the third sub-pixel region form a repeating unit, and are arranged circularly in a row direction;
    sub-pixel regions of odd rows are aligned in a column direction, sub-pixel regions of even rows are aligned in the column direction, and the sub-pixel regions of odd rows and the sub-pixel regions of even rows are staggered by half of the sub-pixel region in the row direction; and
    the first light extraction layer is arranged in the non-opening areas overlapped by three sub-pixel regions in two adjacent rows.

8. The display substrate according to claim 7, wherein the three sub-pixel regions comprise:
    two adjacent sub-pixel regions in a previous row and one sub-pixel region in a latter row among sub-pixel regions in the two adjacent rows.

9. The display substrate according to claim 7, wherein the three sub-pixel regions comprise:
    two adjacent sub-pixel regions in a previous row and one sub-pixel region in a latter row among sub-pixel regions in the two adjacent rows; and
    two adjacent sub-pixel regions in a latter row and one sub-pixel region in a previous row among sub-pixel regions in the two adjacent rows;
    the first light extraction layer comprises:
    a first part, and
    a second part;
    wherein the first part is arranged in the two adjacent sub-pixel regions in the previous row and the one sub-pixel region in the latter row; and the second part is arranged in the two adjacent sub-pixel regions in the latter row and the one sub-pixel region in the previous row.

10. The display substrate according to claim 1, wherein the plurality of sub-pixel regions comprises:
    a first sub-pixel region,
    a second sub-pixel region, and
    a third sub-pixel region;
    wherein each of the first sub-pixel region, the second sub-pixel region and the third sub-pixel region has one opening area; the third sub-pixel region and the second sub-pixel region are respectively squares, and the first sub-pixel region is a rectangle;
    the third sub-pixel region and the second sub-pixel region are arranged alternately in a column direction, a column where the first sub-pixel region is located and a column where the third sub-pixel region and the second sub-pixel region are located are arranged alternately in a row direction, and one first sub-pixel region is arranged in contact with two third sub-pixel regions and two second sub-pixel regions in one column; and
    the first light extraction layer is arranged in the non-opening area in the row direction between opening areas contained in every two columns of first sub-pixel regions.

11. The display substrate according to claim 1, wherein the plurality of sub-pixel regions comprises:
    a first sub-pixel region,
    a second sub-pixel region, and
    a third sub-pixel region;
    wherein each of the first sub-pixel region, the second sub-pixel region and the third sub-pixel region has one opening area; the third sub-pixel region and the second sub-pixel region are respectively squares, and the first sub-pixel region is a rectangle;
    the third sub-pixel region and the second sub-pixel region are arranged alternately in a column direction, a column where the first sub-pixel region is located and a column where the third sub-pixel region and the second sub-pixel region are located are arranged alternately in a row direction, and one first sub-pixel region is arranged in contact with two third sub-pixel regions and two second sub-pixel regions in one column;
    the first light extraction layer comprises:
      a first part, and
      a second part;
      wherein the first part is arranged in the non-opening area between the opening area contained in the third sub-pixel region and the opening area contained in the second sub-pixel region; a width of the first part, a width of the opening area contained in the third sub-pixel region and a width of the opening area contained in the second sub-pixel region are equal in the row direction;
      the second part is arranged in the non-opening area between the opening area contained in the first sub-pixel region and the opening area contained in the third sub-pixel region, and the non-opening area between the opening area contained in the second sub-pixel region and the opening area contained in the first sub-pixel region.

12. The display substrate according to claim 1, wherein the plurality of sub-pixel regions comprises:
    a first sub-pixel region,
    a second sub-pixel region, and
    a third sub-pixel region;
    wherein each of the first sub-pixel region and the second sub-pixel region has one opening area, and the third sub-pixel region has two opening areas; and the first sub-pixel region, the second sub-pixel region and the third sub-pixel region are respectively of hexagons that are non-regular polygons;
    the first sub-pixel region, the second sub-pixel region and the third sub-pixel region form a repeating unit, and are arranged circularly in a row direction;
    sub-pixel regions of odd rows are aligned in a column direction, sub-pixel regions of even rows are aligned in the column direction, and the sub-pixel regions of odd rows and the sub-pixel regions of even rows are staggered by half of the sub-pixel region in the row direction; and
    the first light extraction layer is arranged in the non-opening area between the opening areas contained in every two adjacent first sub-pixel region and second sub-pixel region, the non-opening area between the opening areas contained in every two adjacent second sub-pixel region and third sub-pixel region, and the non-opening area between the opening areas contained in every two adjacent third sub-pixel region and first sub-pixel region.

13. The display substrate according to claim 1, wherein the plurality of sub-pixel regions comprises:
    a first sub-pixel region,
    a second sub-pixel region, and
    a third sub-pixel region;
    wherein the third sub-pixel region has two opening areas, and each of the first sub-pixel region and the second sub-pixel region has one opening area; and the first sub-pixel region, the second sub-pixel region and the third sub-pixel region are respectively of hexagons that are non-regular polygons;
    the first sub-pixel region, the second sub-pixel region and the third sub-pixel region form a repeating unit, and are arranged circularly in a row direction;
    sub-pixel regions of odd rows are aligned in a column direction, sub-pixel regions of even rows are aligned in the column direction, and the sub-pixel regions of odd rows and the sub-pixel regions of even rows are staggered by half of the sub-pixel region in the row direction; and
    the first light extraction layer comprises:
      a first part, and
      a second part;
      wherein the first part is arranged in the non-opening area between the opening areas contained in every two adjacent sub-pixel regions in the row direction, and a length of the first part in the column direction is equal to a length of the first sub-pixel region and a length of the second sub-pixel region; and
      the second part is arranged in the non-opening area where the first sub-pixel region and the third sub-pixel region in a same row are overlapped with the second sub-pixel region in an adjacent row.

14. The display substrate according to claim 1, wherein the plurality of sub-pixel regions comprises:
    a first sub-pixel region,
    a second sub-pixel region, and
    a third sub-pixel region;
    wherein each of the first sub-pixel region, the second sub-pixel region and the third sub-pixel region has one opening area; the first sub-pixel region and the second sub-pixel region are respectively of squares, and the third sub-pixel region is of a rectangle;

the first sub-pixel region and the second sub-pixel region are alternately arranged in an odd row, and the third sub-pixel region is arranged in an even row; sub-pixel regions of odd rows are aligned in a column direction, sub-pixel regions of even rows are aligned in the column direction, and the sub-pixel regions of odd rows and the sub-pixel regions of even rows are staggered by half of the sub-pixel region in the row direction; and the first light extraction layer is arranged in the non-opening area in the row direction and column direction between opening areas contained in every two adjacent sub-pixel regions.

15. The display substrate according to claim 1, wherein the plurality of sub-pixel regions comprises:
a first sub-pixel region,
a second sub-pixel region, and
a third sub-pixel region;
wherein each of the first sub-pixel region, the second sub-pixel region and the third sub-pixel region has one opening area; the first sub-pixel region and the second sub-pixel region are respectively of squares, and the third sub-pixel region is of a rectangle;
the first sub-pixel region and the second sub-pixel region are alternately arranged in an odd row, and the third sub-pixel region is arranged in an even row; sub-pixel regions of odd rows are aligned in a column direction, sub-pixel regions of even rows are aligned in the column direction, and the sub-pixel regions of odd rows and the sub-pixel regions of even rows are staggered by half of the sub-pixel region in the row direction; and
the first light extraction layer comprises:
a first part, and
a second part;
wherein the first part is arranged in the non-opening area between the opening area contained in the third sub-pixel region and the opening area contained in the second sub-pixel region, and the second part is arranged in the non-opening area between the opening area contained in the third sub-pixel region and the opening area contained in the first sub-pixel region.

16. The display substrate according to claim 1, wherein centers of the first light extraction layer in the non-opening areas are collinearly arranged in a same row direction, and centers of the first light extraction layer in the non-opening areas are collinearly arranged in a same column direction.

17. The display substrate according to claim 1, wherein materials of the first light extraction layer and the second light extraction layer are one or a combination of:
non-semiconductor metal oxide,
semiconductor metal oxide, or
organic small molecular material.

18. The display substrate according to claim 17, wherein:
the non-semiconductor metal oxide comprises:
aluminum trioxide $Al_2O_3$; and/or
magnesium oxide MgO;
the semiconductor metal oxide comprises one or a combination of:
zinc oxide ZnO,
molybdenum trioxide $MoO_3$,
vanadium pentoxide $V_2O_5$; or
tungsten trioxide $WO_3$; and
a refractive index of the organic small molecular material is greater than 2.

19. A display apparatus, comprising the display substrate according to claim 1.

20. A mask plate configured to prepare the first light extraction layer according to claim 1;
wherein the mask plate comprises:
a light-transmitting area, and
a non-light-transmitting area;
wherein a pattern of the light-transmitting area is same as a pattern of the first light extraction layer, and a pattern of the non-light-transmitting area is complementary to the pattern of the light-transmitting area.

* * * * *